(12) United States Patent
Miao et al.

US011705517B2

(10) Patent No.: US 11,705,517 B2
(45) Date of Patent: Jul. 18, 2023

(54) NANOSHEET TRANSISTORS WITH STRAINED CHANNEL REGIONS

(71) Applicant: INTERNATIONAL BUSINESS MACHINES CORPORATION, Armonk, NY (US)

(72) Inventors: Xin Miao, Slingerlands, NY (US); Kangguo Cheng, Schenectady, NY (US); Wenyu Xu, Albany, NY (US); Chen Zhang, Albany, NY (US)

(73) Assignee: International Business Machines Corporation, Armonk, NY (US)

( * ) Notice: Subject to any disclaimer, the term of this patent is extended or adjusted under 35 U.S.C. 154(b) by 451 days.

(21) Appl. No.: 17/136,185

(22) Filed: Dec. 29, 2020

(65) Prior Publication Data
US 2021/0151601 A1 May 20, 2021

Related U.S. Application Data

(62) Division of application No. 16/269,094, filed on Feb. 6, 2019, now Pat. No. 10,957,798.

(51) Int. Cl.
*H01L 29/78* (2006.01)
*H01L 29/423* (2006.01)
(Continued)

(52) U.S. Cl.
CPC ...... *H01L 29/7843* (2013.01); *H01L 21/0217* (2013.01); *H01L 21/76224* (2013.01); *H01L 21/823412* (2013.01); *H01L 21/823431* (2013.01); *H01L 21/823437* (2013.01); *H01L 21/823481* (2013.01); *H01L 27/0924* (2013.01); *H01L 29/0673* (2013.01); *H01L 29/0847* (2013.01); *H01L 29/1033* (2013.01); *H01L 29/42392* (2013.01); *H01L 29/66545* (2013.01);
(Continued)

(58) Field of Classification Search
None
See application file for complete search history.

(56) References Cited

U.S. PATENT DOCUMENTS 8,963,250 B2 2/2015 Shimizu et al.
9,048,300 B2 6/2015 Chen et al.
(Continued)

FOREIGN PATENT DOCUMENTS

KR 1020180067146 6/2018

OTHER PUBLICATIONS

Connelly, D., Zheng, P., & Liu, T. J. K. (2017). Channel Stress and Ballistic Performance Advantages of Gate-All-Around FETs and Inserted-Oxide FinFETs. IEEE Transactions on Nanotechnology, 16(2), pp. 209-216.
(Continued)

*Primary Examiner* — Bilkis Jahan
(74) *Attorney, Agent, or Firm* — Cantor Colburn LLP; Samuel Waldbaum

(57) ABSTRACT

A method of fabricating a semiconductor device is described. The method includes forming a nanosheet stack on a substrate, the nanosheet stack includes nanosheet channel layers. A gate is formed around the nanosheet channel layers of the nanosheet stack. A strained material is formed along a sidewall surface of the gate. The strained material is configured to create strain in the nanosheet channel layers of the nanosheet stack.

20 Claims, 10 Drawing Sheets

(51) Int. Cl.
  *H01L 29/66* (2006.01)
  *H01L 21/02* (2006.01)
  *H01L 21/8234* (2006.01)
  *H01L 29/10* (2006.01)
  *H01L 21/762* (2006.01)
  *H01L 29/08* (2006.01)
  *H01L 27/092* (2006.01)
  *H01L 29/06* (2006.01)
  *H01L 21/265* (2006.01)
  *H01L 21/311* (2006.01)
  *H01L 21/3065* (2006.01)
  *H01L 21/308* (2006.01)

(52) U.S. Cl.
  CPC .. *H01L 29/66553* (2013.01); *H01L 29/66795* (2013.01); *H01L 29/785* (2013.01); *H01L 21/0262* (2013.01); *H01L 21/02532* (2013.01); *H01L 21/26513* (2013.01); *H01L 21/3065* (2013.01); *H01L 21/3081* (2013.01); *H01L 21/31116* (2013.01)

(56) References Cited

U.S. PATENT DOCUMENTS

| | | |
|---|---|---|
| 9,356,025 B2 | 5/2016 | Zhu et al. |
| 9,711,414 B2 | 7/2017 | Hatcher et al. |
| 9,728,602 B2 | 8/2017 | Yu et al. |
| 10,008,583 B1 | 6/2018 | Rodder et al. |
| 10,074,575 B1 | 9/2018 | Guillorn et al. |
| 2016/0049489 A1* | 2/2016 | Wan .................. H01L 29/66545 438/157 |
| 2017/0110554 A1 | 4/2017 | Tak |
| 2017/0117359 A1 | 4/2017 | Cheng et al. |
| 2017/0323949 A1* | 11/2017 | Loubet .............. H01L 29/66439 |
| 2019/0378911 A1 | 12/2019 | Lee |
| 2020/0219970 A1* | 7/2020 | Mannebach .......... H01L 29/785 |
| 2020/0219979 A1* | 7/2020 | Rachmady .......... H01L 21/8221 |
| 2020/0251593 A1 | 8/2020 | Miao et al. |

OTHER PUBLICATIONS

Kumar et al,. "A Simple, Unified 3D Stress Model for Device Design in Stress-Enhanced Mobility Technologies," SISPAD., Sep. 5-7, 2012, pp. 300-303.

List of IBM Patents or Patent Applications Treated as Related; Date Filed: Jan. 11, 2021, 2 pages.

Sung, P. J., Cho, T. C., Hou, F. J. et al. (2017). High-performance uniaxial tensile strained n-channel JL SOI FETs and triangular JL bulk FinFETs for nanoscaled applications. IEEE Transactions on Electron Devices, 64(5), pp. 2054-2060.

* cited by examiner

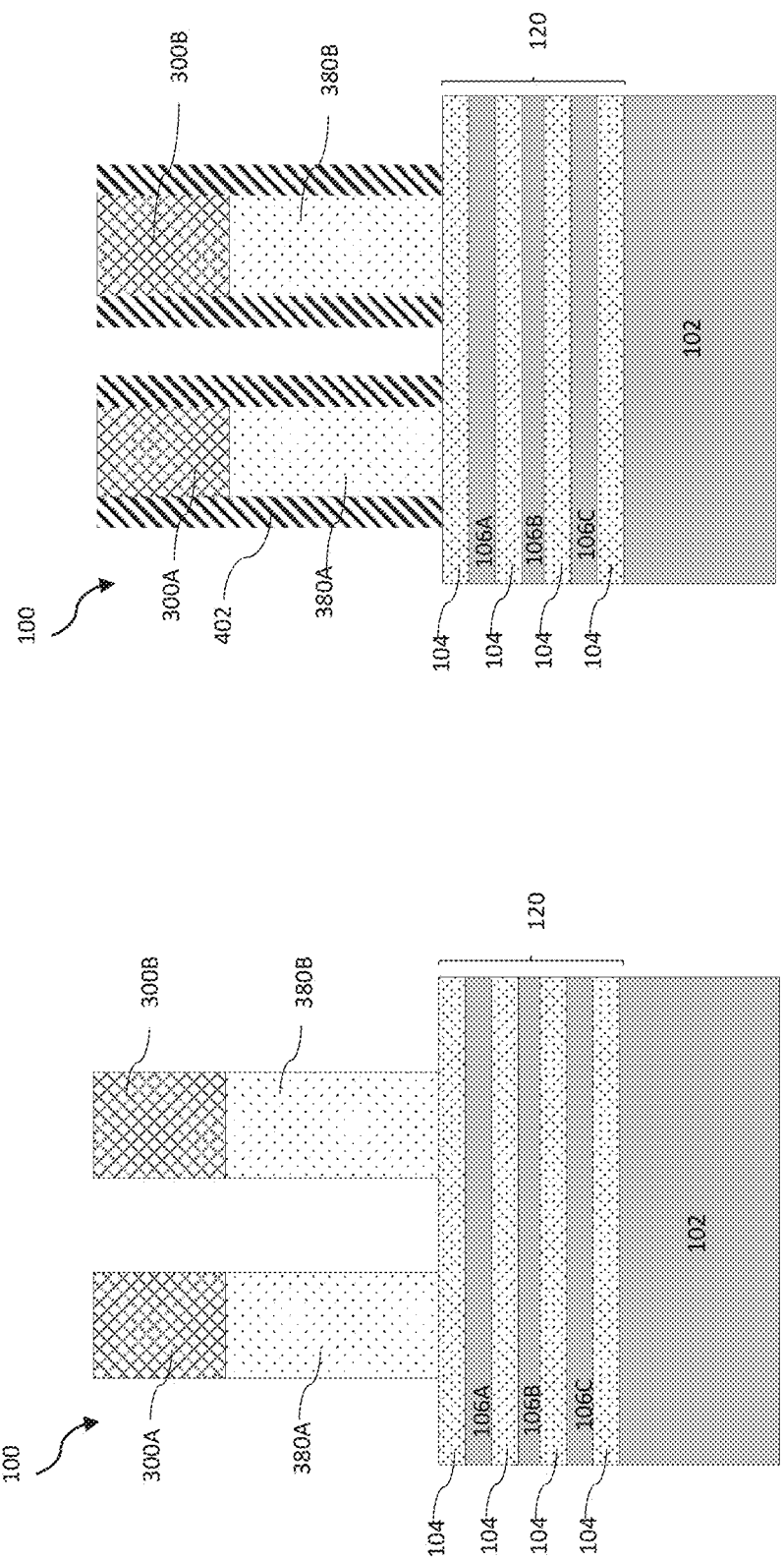

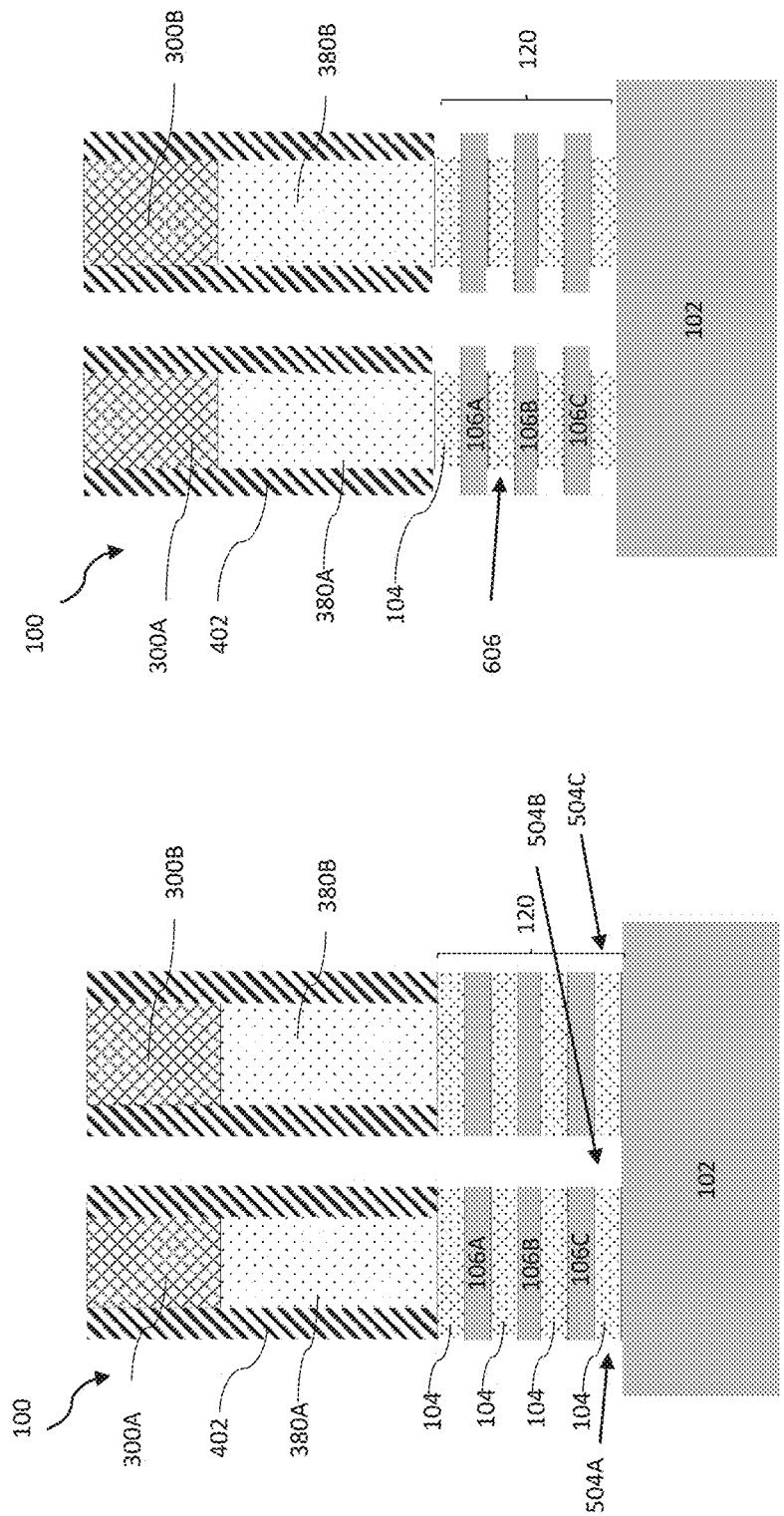

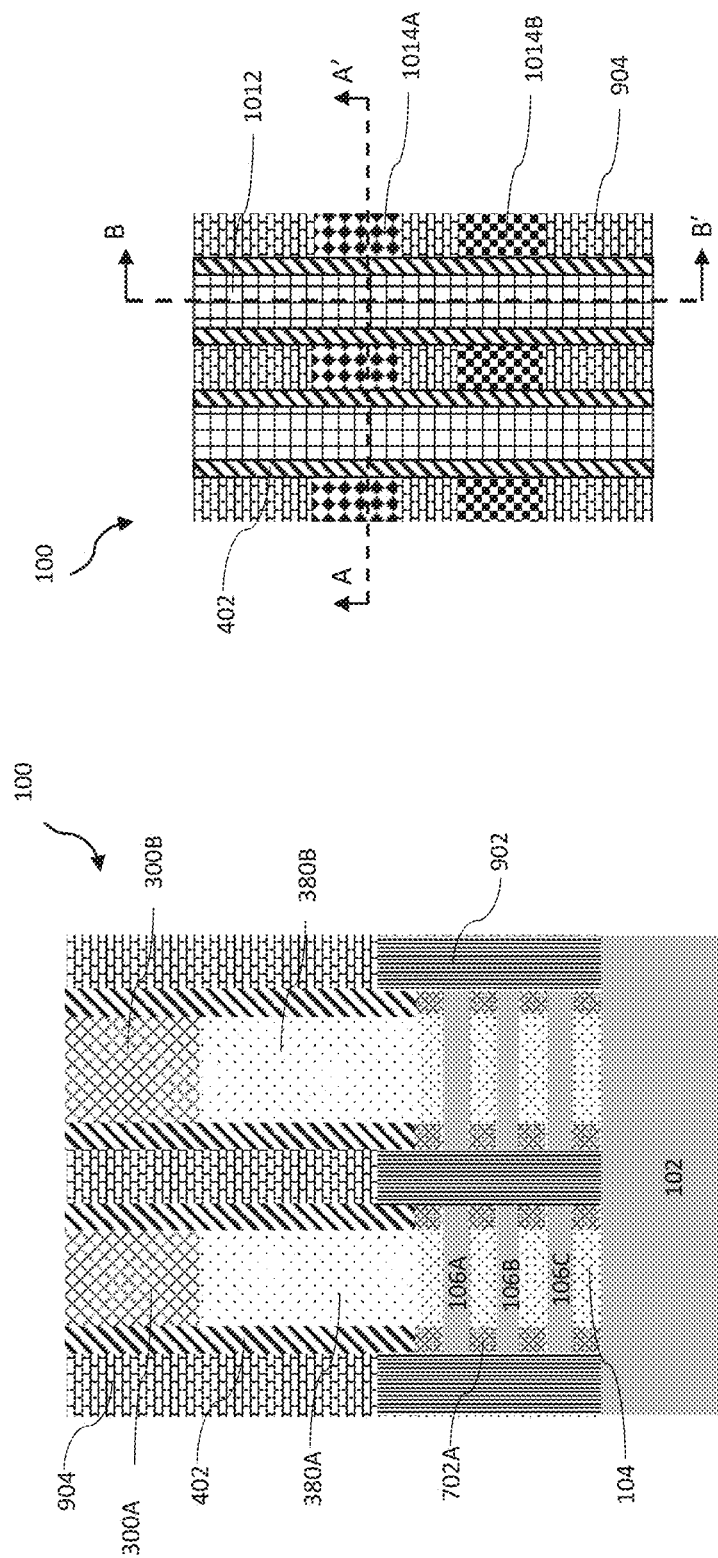

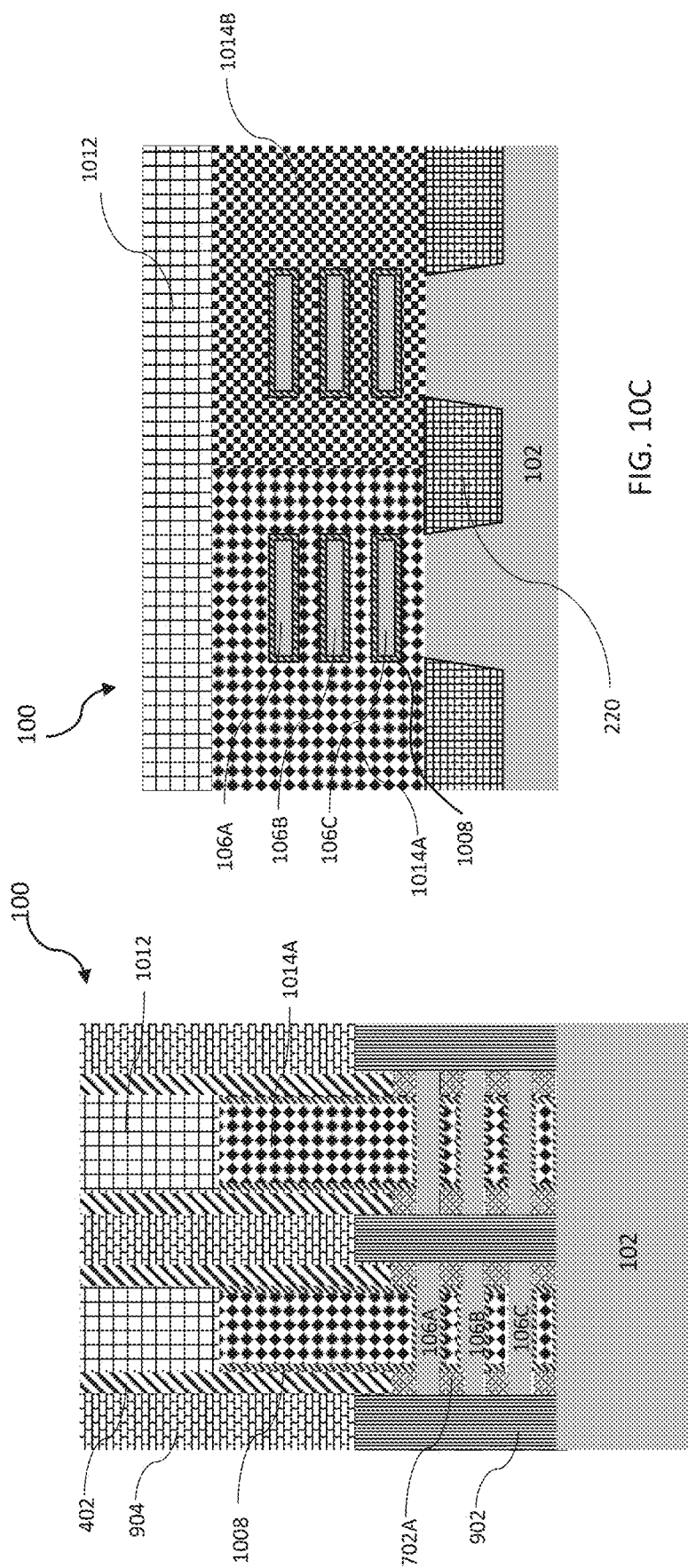

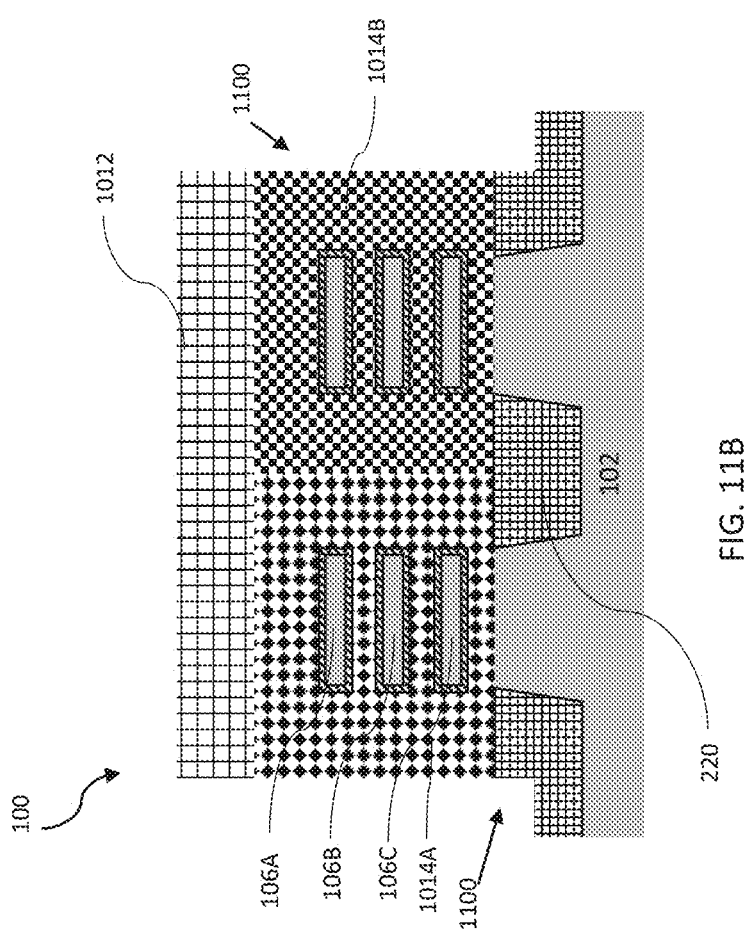
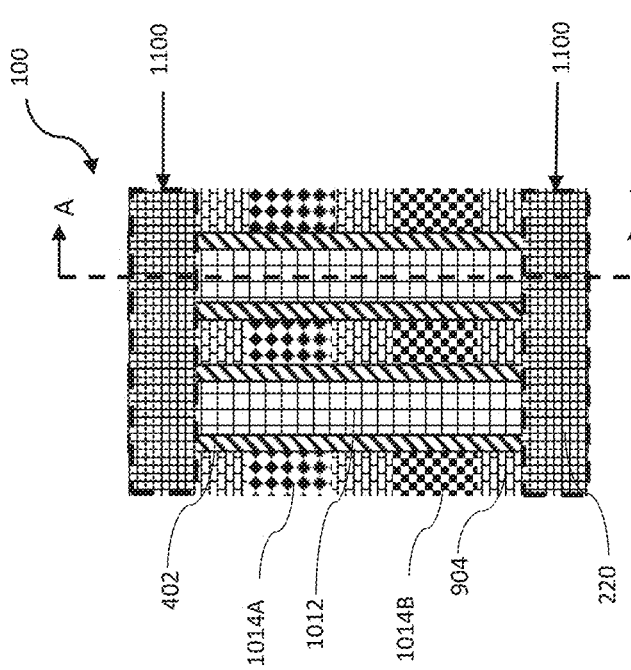
FIG. 11B
FIG. 11A

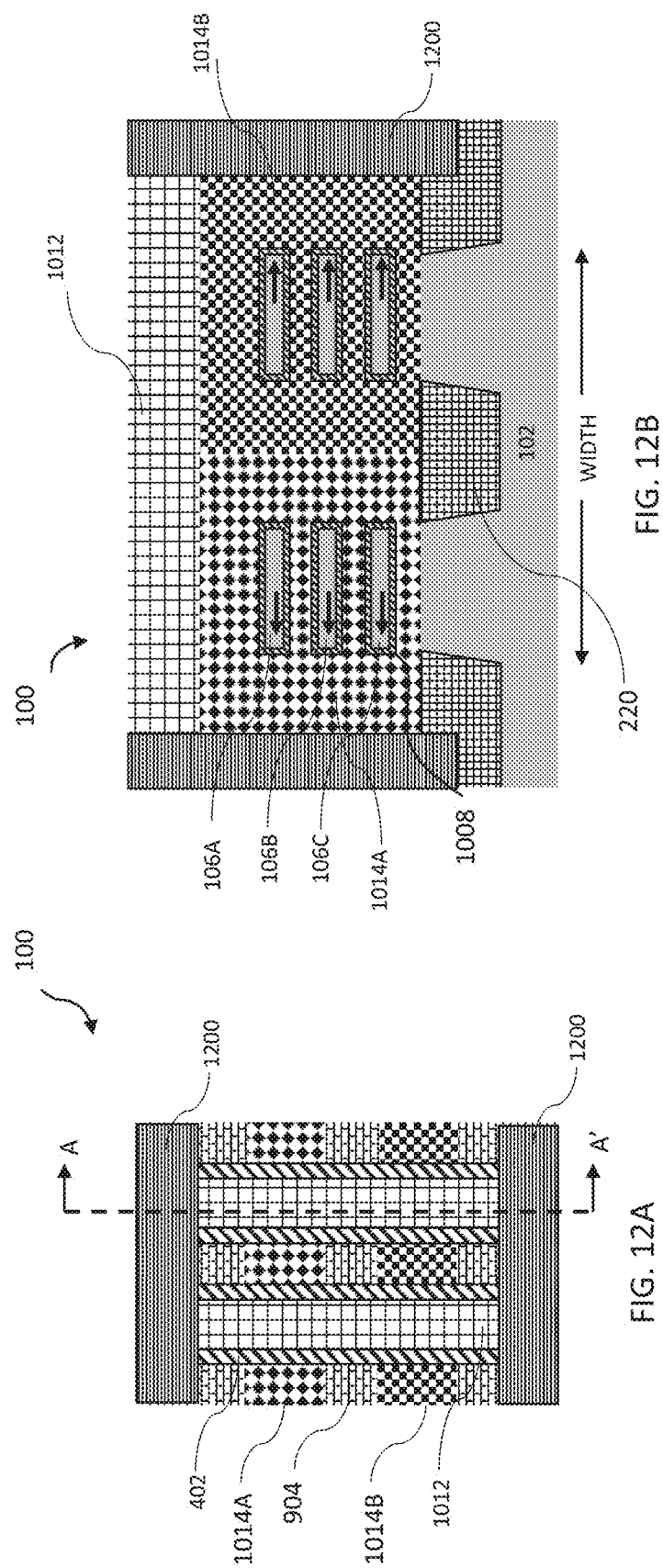

```
1302 ┌─ FORM ALTERNATING SACRIFICIAL AND CHANNEL NANOSHEETS
       ↓
1304 ┌─ PATTERN THE NANOSHEETS INTO FINS AND FORM SHALLOW TRENCH ISOLATION (STI) REGIONS
       ↓
1306 ┌─ FORM DUMMY GATES OVER THE FINS AND HARD MASKS OVER THE GATES
       ↓
1308 ┌─ FORM SPACERS OVER THE SIDE WALLS OF THE DUMMY GATE AND HARD MASKS
       ↓
1310 ┌─ SOURCE/DRAIN RECESS
       ↓
1312 ┌─ SACRIFICIAL NANOSHEET ETCH BACK
       ↓
1314 ┌─ DEPOSIT CONFORMAL INNER SPACER
       ↓
1316 ┌─ ETCH TO REMOVE EXCESS INNER SPACER MATERIAL
       ↓
1318 ┌─ FORM SOURCE/DRAIN, DEPOSIT ILD, AND PERFORM CMP
       ↓
1320 ┌─ REMOVE DUMMY GATE AND FORM REPLACEMENT METAL GATE (RMG), FORM SAC CAP
       ↓
1322 ┌─ PERFORM SAC CAP, SPACER, RMG, AND ILD CUT ETCH TO FORM A TRENCH
       ↓
1324 ┌─ FILL THE TRENCH WITH A TENSILE STRAINED MATERIAL
```

NANOSHEET TRANSISTORS WITH STRAINED CHANNEL REGIONS

DOMESTIC PRIORITY

This application is a divisional of U.S. patent application Ser. No. 16/269,094, filed Feb. 6, 2019, the disclosure of which is incorporated by reference herein in its entirety.

BACKGROUND

The present invention generally relates to fabrication methods and resulting structures for semiconductor devices, and more specifically, to nanosheet transistors with strained channel regions.

The metal oxide semiconductor field effect transistor (MOSFET) is a type of field effect transistor (FET) that can be used for switching electronic signals. The MOSFET has a source, a drain, and a metal oxide gate electrode. A channel region communicatively couples the source to the drain. The metal gate is electrically insulated from the channel region by a thin layer of insulating material, for example, silicon dioxide or high dielectric constant (high-k) dielectrics, which makes the input resistance of the MOSFET relatively high. The gate voltage controls whether or not the channel region conducts, thereby determining whether or not the path from the source through the channel region to drain is an open circuit ("off") or a resistive path ("on").

FETs can be n-type (NFET) or p-type (PFET). NFETs use negatively charged particles (electrons) as the majority carriers and are created by doping the source and drain regions with so-called n-type dopants that create negatively charged majority carriers in the source and drain regions. PFETs use positively charged particles (holes) as the majority carriers and are created by doping the source and drain regions with so-called p-type dopants that create positively charged majority carriers in the source and drain regions. In contemporary semiconductor device fabrication processes, a large number of NFETs and PFETs are fabricated on a single wafer. Non-planar transistor device architectures, such as nanosheet (or nanowire) transistors, can provide increased device density and increased performance over planar FETs. Nanosheet transistors, in contrast to conventional planar FETs, include a gate stack that wraps around the full perimeter of multiple nanosheet channel regions for improved control of channel current flow.

SUMMARY

Embodiments of the present invention are directed to a method for fabricating a semiconductor device, such as, nanosheet MOSFETs with strained channel. The method includes forming a nanosheet stack on a substrate, wherein the nanosheet stack includes nanosheet channel layers, forming a gate around the nanosheet channel layers of the nanosheet stack, and forming a strained material along a sidewall surface of the gate, wherein the strained material is configured to create strain in the channel nanosheet layers of the nanosheet stack.

Embodiments of the present invention are directed to a method of fabricating a semiconductor device. The method includes forming a pFET portion and a nFET portion on a substrate, forming a gate around the pFET portion and the nFET portion, forming a first trench by removing a portion of the gate material from the pFET portion, forming a second trench by removing a portion of the gate material from the nFET portion, forming a strained material in the first and the second trenches.

Embodiments of the present invention are directed to a semiconductor device, such as, nanosheet MOSFETs with strained channel. The semiconductor device includes a substrate, a nanosheet stack including nanosheet channels, source and drain regions formed on the substrate; a gate around the nanosheet stack; and a trench formed through a portion of the gate, spacer, and inter-level dielectric extending into the substrate, wherein the trench is filled with a strained material.

Additional technical features and benefits are realized through the techniques of the present invention. Embodiments and aspects of the invention are described in detail herein and are considered a part of the claimed subject matter. For a better understanding, refer to the detailed description and to the drawings.

BRIEF DESCRIPTION OF THE DRAWINGS

The specifics of the exclusive rights described herein are particularly pointed out and distinctly claimed in the claims at the conclusion of the specification. The foregoing and other features and advantages of the embodiments of the invention are apparent from the following detailed description taken in conjunction with the accompanying drawings in which:

FIG. 3B depicts a cross-sectional side view of the semiconductor device taken along line A-A' in FIG. 3A according to embodiments of the invention;

FIG. 4 depicts a cross-sectional side view of the semiconductor device after a fabrication stage according to embodiments of the invention;

FIG. 5 depicts a cross-sectional side view of the semiconductor device after a fabrication stage according to embodiments of the invention;

FIG. 6 depicts a cross-sectional side view of the semiconductor device after a fabrication stage according to embodiments of the invention;

FIG. 9 depicts a cross-sectional side view of the semiconductor device after a fabrication stage according to embodiments of the invention;

FIG. 10A depicts a top view of the semiconductor device after a fabrication stage according to embodiments of the invention;

FIG. 10B depicts a cross-sectional side view of the semiconductor device taken along line A-A' in FIG. 10A according to embodiments of the invention;

FIG. 10C depicts a cross-sectional side view of the semiconductor device taken along line B-B' in FIG. 10A according to embodiments of the invention;

FIG. 11A depicts a top view of the semiconductor device after a fabrication stage according to embodiments of the invention;

FIG. 11B depicts a cross-sectional side view of the semiconductor device taken along line A-A' in FIG. 11A according to embodiments of the invention;

FIG. 12A depicts a top view of the semiconductor device after a fabrication stage according to embodiments of the invention;

FIG. 12B depicts a cross-sectional side view of the semiconductor device taken along line A-A' in FIG. 12A according to embodiments of the invention; and FIG. 13 depicts a flow diagram illustrating a methodology according to one or more embodiments of the invention.

Figure 2:
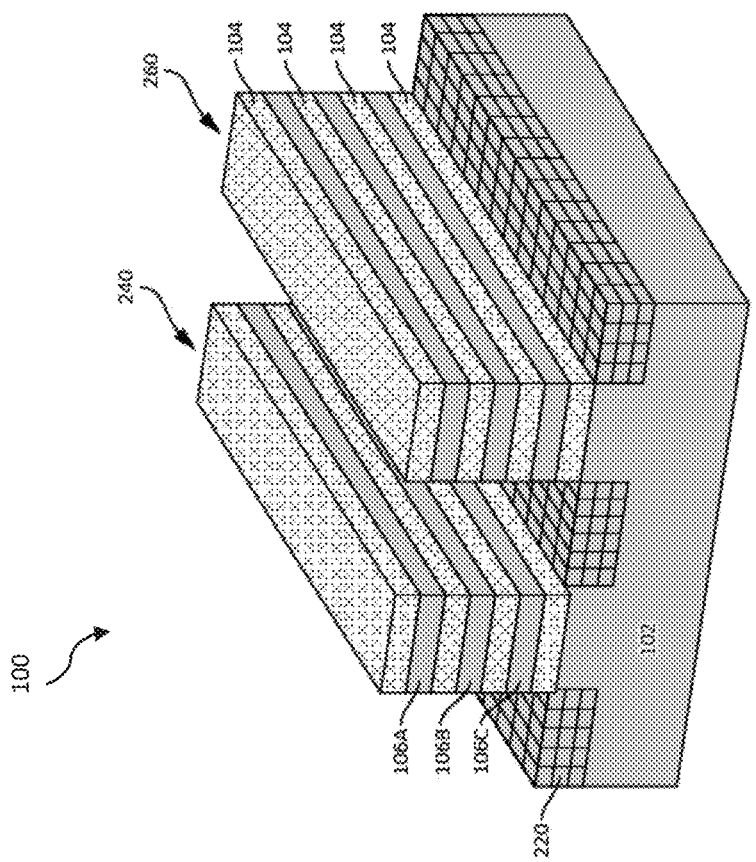
FIG. 2 depicts a three-dimensional view of the semiconductor device after a fabrication stage according to embodiments of the invention.

The diagrams depicted herein are illustrative. There can be many variations to the diagram or the operations described therein without departing from the spirit of the invention. For instance, the actions can be performed in a differing order or actions can be added, deleted or modified. Also, the term "coupled" and variations thereof describes having a communications path between two elements and does not imply a direct connection between the elements with no intervening elements/connections between them. All of these variations are considered a part of the specification.

In the accompanying figures and following detailed description of the described embodiments, the various elements illustrated in the figures are provided with two or three digit reference numbers. With minor exceptions, the leftmost digit(s) of each reference number correspond to the figure in which its element is first illustrated.

DETAILED DESCRIPTION

For the sake of brevity, conventional techniques related to semiconductor device and integrated circuit (IC) fabrication may or may not be described in detail herein. Moreover, the various tasks and process steps described herein can be incorporated into a more comprehensive procedure or process having additional steps or functionality not described in detail herein. In particular, various steps in the manufacture of semiconductor devices and semiconductor-based ICs are well known and so, in the interest of brevity, many conventional steps will only be mentioned briefly herein or will be omitted entirely without providing the well-known process details.

It is understood in advance that although this description includes a detailed description of an exemplary n-type and p-type gate-all-around (GAA) nanosheet FET architecture having silicon channel nanosheets and silicon germanium sacrificial nanosheets, implementation of the teachings recited herein are not limited to the particular FET architecture described herein. Rather, embodiments of the present invention are capable of being implemented in conjunction with any other type of FET device now known or later developed, including, for example, GAA nanosheet FET architectures having silicon germanium channel nanosheets and silicon sacrificial nanosheets or having channel nanosheets and sacrificial nanosheets formed from different III-V compound semiconductors.

Turning now to a description of technologies that are more specifically relevant to aspects of the present invention, transistors are semiconductor devices commonly found in a wide variety of ICs. A transistor is essentially a switch. When a voltage is applied to a gate of the transistor that is greater than a threshold voltage, the switch is turned on, and current flows through the transistor. When the voltage at the gate is less than the threshold voltage, the switch is off, and current does not flow through the transistor.

Typical semiconductor devices are formed using active regions of a wafer. The active regions are defined by isolation regions used to separate and electrically isolate adjacent semiconductor devices. For example, in an integrated circuit having a plurality of MOSFETs, each MOSFET has a source and a drain that are formed in an active region of a semiconductor layer by implanting n-type or p-type impurities in the layer of semiconductor material. Disposed between the source and the drain is a channel (or body) region. Disposed above the body region is a gate electrode. The gate electrode and the body are spaced apart by a gate dielectric layer. Complementary metal oxide semiconductor (CMOS) is a technology that uses complementary and symmetrical pairs of p-type and n-type MOSFETs to implement logic functions. The channel region connects the source and the drain, and, under appropriate conditions, electrical current flows through the channel region from the source to the drain. The electrical current flow is induced in the channel region by a voltage applied at the gate electrode.

The wafer footprint of an FET is related to the electrical conductivity of the channel material. If the channel has a relatively high conductivity, either by having a channel material with higher mobility or by having more conducting surfaces per footprint, the FET can be made with a correspondingly smaller wafer footprint. The previously described GAA nanosheet FET is a known architecture for providing a relatively small FET footprint by forming the channel region as a series of nanosheets. In a known GAA configuration, a nanosheet-based FET includes a source region, a drain region and stacked nanosheet channels between the source and drain regions. A gate surrounds the stacked nanosheet channels and regulates electron flow through the nanosheet channels between the source and drain regions. GAA nanosheet FETs are fabricated by forming alternating layers of channel nanosheets and sacrificial nanosheets. The sacrificial nanosheets are released from the channel nanosheets before the FET device is finalized.

For n-type FETs, the channel nanosheets are typically silicon (Si) and the sacrificial nanosheets are typically silicon germanium (SiGe). For p-type FETs, the channel nanosheets are typically SiGe and the sacrificial nanosheets are typically Si. In some implementations, the channel nanosheet of a p-FET can be SiGe or Si, and the sacrificial nanosheets can be Si or SiGe. Forming the GAA nanosheets from alternating layers of channel nanosheets formed from a first type of semiconductor material (e.g., Si for n-type FETs, and SiGe for p-type FETs) and sacrificial nanosheets formed from a second type of semiconductor material (e.g., SiGe for n-type FETs, and Si for p-type FETs) provides superior channel electrostatics control, which is necessary for continuously scaling gate lengths down to seven (7) nanometer CMOS technology and below. The use of multiple layered SiGe/Si sacrificial/channel nanosheets (or Si/SiGe sacrificial/channel nanosheets) to form the channel regions in GAA FET semiconductor devices provides desirable device characteristics, including the introduction of strain at the interface between SiGe and Si.

Forming the channels of an FET from strained semiconductor material increases the mobility of charge carriers (i.e., electrons or holes) passing through channel's semiconductor lattice. Incorporating strain into the FET channel stretches the crystal lattice, thereby increasing charge carrier mobility in the channel so that the FET device becomes a more responsive switch. Introducing a compressive strain into a PFET transistor tends to increase hole mobility in the channel, resulting in a faster switching response to changes in voltage applied to the transistor gate. Similarly, introducing a tensile strain into an NFET transistor tends to increase electron mobility in the channel, also resulting in a faster switching response.

As GAA FET semiconductor devices are scaled down particularly for sub-7 nanometer CMOS technology, obtaining high channel mobility by introducing strain at the nanosheet channel becomes challenging for a variety of reasons, including, for example, the small and poly-crystalline epitaxially grown source/drain regions (from multiple growth seeds in source/drain), which result in little longitudinal strain obtained from the epitaxially grown source/drain regions.

Turning now to an overview of the aspects of the invention, one or more embodiments of the invention address the above-described shortcomings of the prior art by introducing transverse strain in the channel. Accordingly, embodiments of the present invention provide fabrication methodologies and resulting devices for forming stacked nanosheet channel transistors having improved channel mobility by introducing transverse strain in the channel. In one or more embodiments of the present invention, the transverse strain is introduced by cutting a trench in the replacement metal gate (RMG), the spacer, and the inter-level dielectric and filling the trench with a strained material.

Turning now to a more detailed description of aspects of the present invention, FIGS. 1-12 are diagrams illustrating a semiconductor structure 100 after selected stages of a fin-first, wire-last replacement gate fabrication methodology for forming an exemplary GAA nanosheet MOSFET according to one or more embodiments of the present invention. As described in greater detail herein below, in accordance with one or more embodiments of the present invention, a trench is formed by etching away portions of self-aligned contact (SAC) cap, gate metal, spacer, and ILD. The trench is filled with a suitable tensile strained material.

Figure 1:
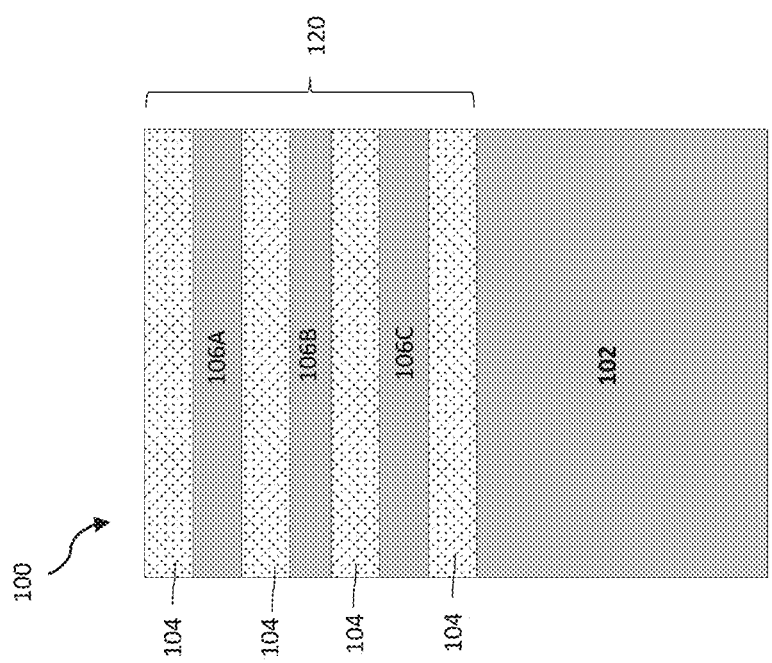
FIG. 1 depicts a cross-sectional side view of a semiconductor device after an initial fabrication stage according to embodiments of the invention.

FIG. 1 depicts a cross-sectional side view of a semiconductor device 100 including a substrate 102. The substrate 102 can be a silicon (Si) substrate, although other materials or substrates can be used. After initial fabrication processing, an epitaxy nanosheet stack 120 is formed on the substrate 102. The epitaxy nanosheet stack 120 includes an alternating series of silicon germanium (SiGe) sacrificial nanosheet layers 104 and silicon (Si) channel nanosheet layers 106A, 106B, and 106C. The channel nanosheet layers 106A, 106B, and 106C, individually or collectively, can be more generally referred to as channel layers 106. Although three channel layers 106 are shown, more or fewer channel layers 106 can be used, and the number of sacrificial layers 104 can be increased or decreased accordingly.

In one or more embodiments of the invention, the alternating series of silicon germanium sacrificial nanosheets 104 and silicon channel nanosheets 106 are formed by epitaxially growing one layer and then the next until the desired number and desired thicknesses of the nanosheets are achieved. Epitaxial materials can be grown from gaseous or liquid precursors. Epitaxial materials can be grown using vapor-phase epitaxy (VPE), molecular-beam epitaxy (MBE), liquid-phase epitaxy (LPE), or other suitable process. Epitaxial silicon, silicon germanium, and/or carbon doped silicon (Si:C) silicon can be doped during deposition (in-situ doped) by adding dopants, n-type dopants (e.g., phosphorus or arsenic) or p-type dopants (e.g., boron or gallium), depending on the type of transistor.

The terms "epitaxial growth and/or deposition" and "epitaxially formed and/or grown" mean the growth of a semiconductor material (crystalline material) on a deposition surface of another semiconductor material (crystalline material), in which the semiconductor material being grown (crystalline overlayer) has substantially the same crystalline characteristics as the semiconductor material of the deposition surface (seed material). In an epitaxial deposition process, the chemical reactants provided by the source gases are controlled and the system parameters are set so that the depositing atoms arrive at the deposition surface of the semiconductor substrate with sufficient energy to move about on the surface such that the depositing atoms orient themselves to the crystal arrangement of the atoms of the deposition surface. Therefore, an epitaxially grown semiconductor material has substantially the same crystalline characteristics as the deposition surface on which the epitaxially grown material is formed. For example, an epitaxially grown semiconductor material deposited on a {100} orientated crystalline surface will take on a {100} orientation. In some embodiments of the invention, epitaxial growth and/or deposition processes are selective to forming on semiconductor surfaces, and generally do not deposit material on exposed surfaces, such as silicon dioxide or silicon nitride surfaces.

In some embodiments of the invention, the gas source for the deposition of epitaxial semiconductor material include a silicon containing gas source, a germanium containing gas source, or a combination thereof. For example, an epitaxial silicon layer can be deposited from a silicon gas source that is selected from the group consisting of silane, disilane, trisilane, tetrasilane, hexachlorodisilane, tetrachlorosilane, dichlorosilane, trichlorosilane, methylsilane, dimethylsilane, ethylsilane, methyldisilane, dimethyldisilane, hexamethyldisilane and combinations thereof. An epitaxial germanium layer can be deposited from a germanium gas source that is selected from the group consisting of germane, digermane, halogermane, dichlorogermane, trichlorogermane, tetrachlorogermane and combinations thereof. While an epitaxial silicon germanium alloy layer can be formed utilizing a combination of such gas sources. Carrier gases like hydrogen, nitrogen, helium and argon can be used.

In FIG. 2, known processing techniques have been applied to the alternating series of silicon germanium sacrificial nanosheet layers 104 and silicon channel nanosheet layers 106 (shown in FIG. 1) to pattern the epitaxy nanosheet stack 120 into nanosheet stacks 240 and 260 (also referred as, fins 240 and 260). FIG. 2 depicts a three-dimensional view of the semiconductor device after formation of the fins 240 and 260. Shallow trench isolation regions (STI) 220 are formed in the areas etched during fin formation, as best seen in FIG. 2.

Figure 3A:
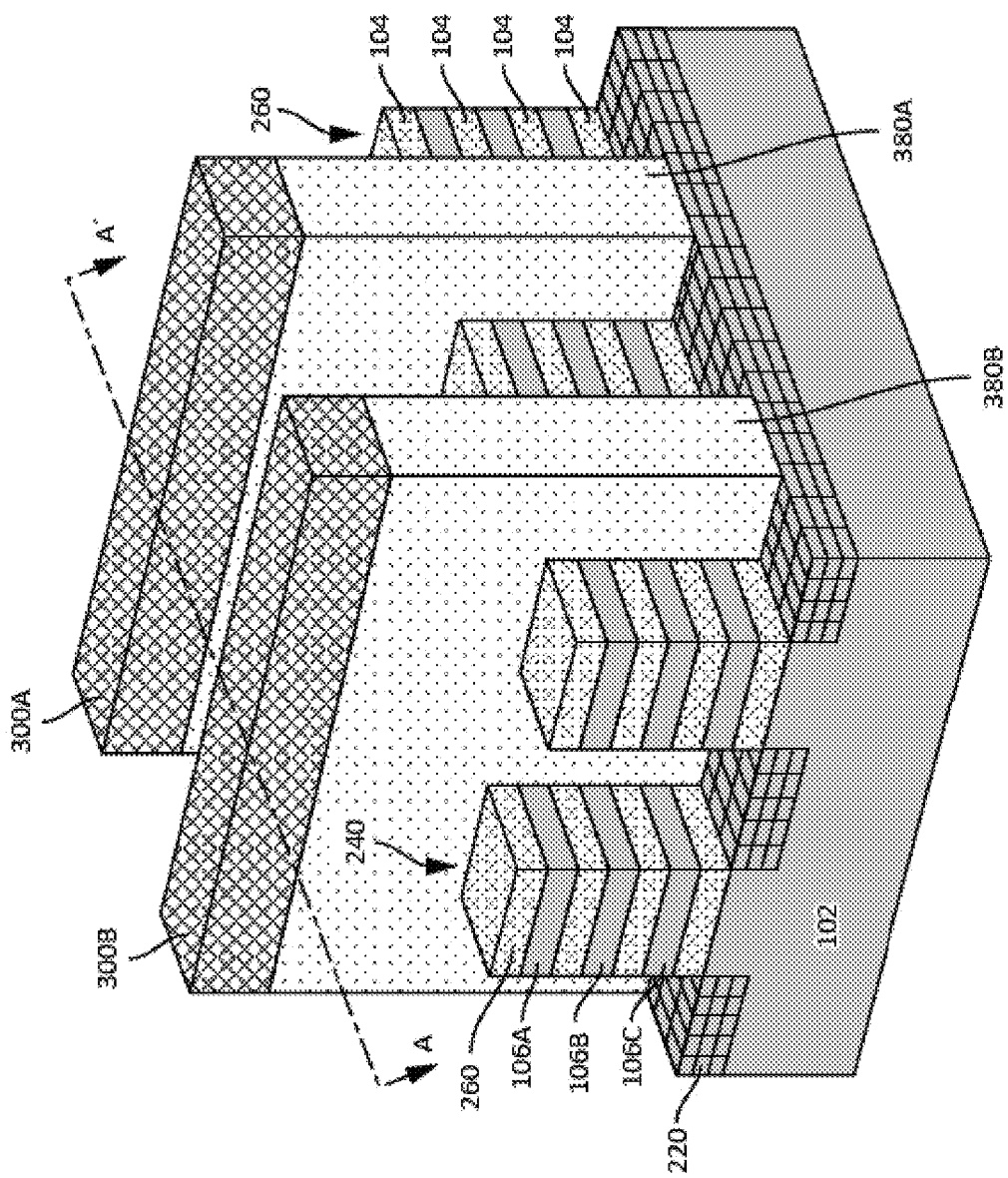
FIG. 3A depicts a three-dimensional view of the semiconductor device after a fabrication stage according to embodiments of the invention.

FIG. 3A depicts a three-dimensional view of the semiconductor device 100 after formation of the dummy gates 380A and 380B, and hard masks 300A and 300B on top of the dummy gates 380A and 380B, respectively. FIG. 3B depicts a cross-sectional side view of the semiconductor device of FIG. 3A where the cross-section is taken along line A-A'.

As shown in FIG. 3A, dummy gates 380A and 380B are formed over the tops and sidewalls of the fins 240 and 260. The dummy gates 380A and 380B are collectively referred as dummy gates 380. In one or more embodiments of the invention, the dummy gates are in the form of fins and are perpendicular to fins 240 and 260. Hard masks (HM) 300A and 300B are formed on top of the dummy gates 380A and 380B, respectively. In one or more embodiments of the invention, the dummy gates 380A and 380B are formed from amorphous silicon (a-Si), and hard masks 300A and 300B are formed from silicon nitride (SiN), silicon oxide, an oxide/nitride stack, or similar materials and configurations.

The hard masks 300A and 300B can be formed by first depositing the hard mask material (for example, silicon nitride) onto the dummy gates 380A and 380B using, for example, chemical vapor deposition (CVD), plasma enhanced CVD (PECVD) or any suitable technique for dielectric deposition that does not induce a physical or chemical change to the dummy gates 380A and 380B. The material of the hard mask is patterned into two hard masks 300A and 300B, and this pattern is used to etch into the material of the dummy gates to form dummy gates 380A and 380B.

FIG. 4 depicts a cross-sectional side view of the semiconductor device 100 after a next fabrication stage. As shown in FIG. 4, offset spacers 402 are formed along the sidewalls of the dummy gates 380 and hard masks 300. Offset spacers 402 can be formed using a spacer pull down formation process. Offset spacers 402 can also be formed using a sidewall image transfer (SIT) spacer formation process, which includes spacer material deposition followed by directional RIE of the deposited spacer material. The material of the offset spacer 402 can include, but are not limited to, silicon nitride, silicon borocarbonitride (SiBCN), silicon oxycarbonitride (SiOCN), and etc.

FIG. 5 depicts a cross-sectional side view of the semiconductor device 100 after a next fabrication stage. As shown in FIG. 5, the offset spacers 402 are in effect used as a mask, and portions of the silicon germanium sacrificial nanosheets 104 and the silicon channel nanosheets 106, that are not under the offset spacers 402 and the dummy gates 380 are etched through to form trenches 504A, 504B, and 504C in the source/drain regions. In one or more embodiments of the invention, silicon reactive-ion etching (RIE) is used to etch through the alternating series of silicon germanium sacrificial nanosheets 104 and silicon channel nanosheets 106.

As described in greater detail herein below, portions of silicon nanosheets 106, once released from the silicon germanium sacrificial nanosheets 104, will form the nanosheet channels of the semiconductor device. Because the fin etch is being performed before the dummy gate/replacement gate steps (described in greater detail later herein), the semiconductor device fabrication processes described herein can be referred to as a fin first process. Additionally, because the silicon nanosheet channels 106 will be released from the silicon germanium sacrificial nanosheets 104 after the dummy gate/replacement gate steps, the semiconductor device fabrication process described herein can also be referred to as a wire/sheet last process.

FIG. 6 depicts a cross-sectional side view of the semiconductor device 100 after a next fabrication stage. As shown in FIG. 6, silicon germanium sacrificial nanosheets 104 have been pulled back from underneath offset spacers 402 using, for example, a hydrogen chloride (HCL) gas isotropic etch process, which etches silicon germanium without attacking silicon. Cavities 606 are formed by spaces that were occupied by the removed portions of silicon germanium sacrificial nanosheets 104.

Figure 7:
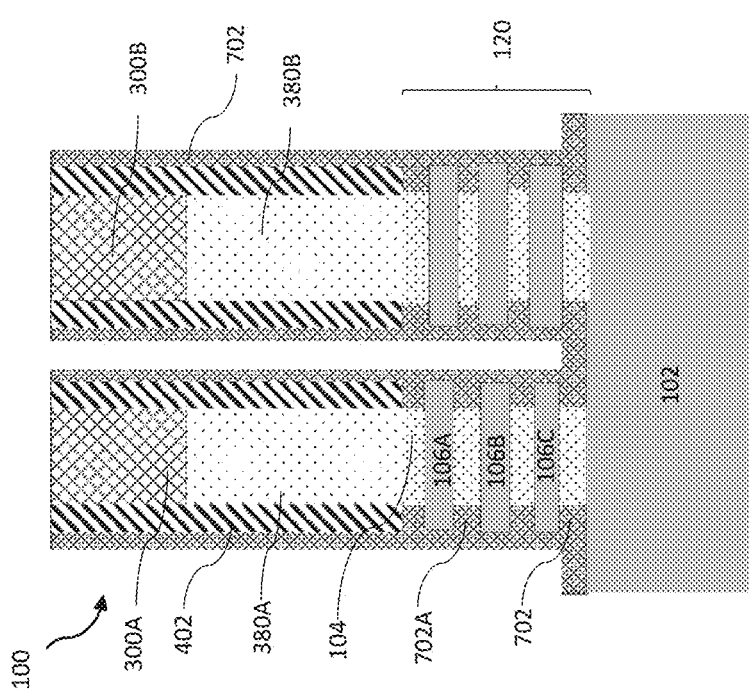
FIG. 7 depicts a cross-sectional side view of the semiconductor device after a fabrication stage according to embodiments of the invention.

FIG. 7 depicts a cross-sectional side view of the semiconductor device 100 after a next fabrication stage. As shown in FIG. 7, a layer of spacer material 702 is conformally deposited over the semiconductor structure 100. Specifically, portions of the layer of semiconductor material 702 fills in the cavities 606 (shown in FIG. 6) to form inner spacers 702A. In one or more embodiments of the invention, the layer spacer material 702 and the inner spacers 702A can be a dielectric material different than the spacers 402 and selected from silicon nitride, silicon borocarbonitride (SiBCN), silicon oxycarbonitride (SiOCN), and similar materials.

Figure 8:
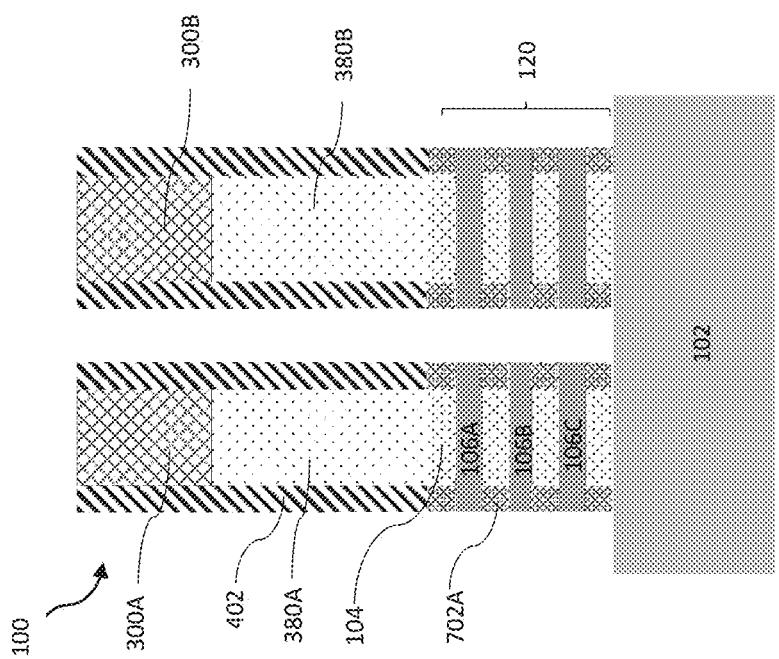
FIG. 8 depicts a cross-sectional side view of the semiconductor device after a fabrication stage according to embodiments of the invention.

FIG. 8 depicts a cross-sectional side view of the semiconductor device 100 after a next fabrication stage. As shown in FIG. 8, according to one or more exemplary embodiments of the invention, an isotropic etch, such as wet chemical etch, is used to remove the layer of spacer material 702 while retaining the inner spacer material 702A.

FIG. 9 depicts a cross-sectional side view of the semiconductor device 100 after a next fabrication stage. As shown in FIG. 9, source/drain regions 902 are formed using an epitaxial layer growth process on the ends of exposed silicon channel nanosheets 106 and the substrate 102. In-situ doping (ISD) is applied to form doped source/drain regions 902, thereby creating the necessary junctions of the semiconductor device. Virtually all semiconductor transistors are based on the formation of junctions. Junctions are capable of both blocking current and allowing it to flow, depending on an applied bias. Junctions are typically formed by placing two semiconductor regions with opposite polarities into contact with one another. The most common junction is the p-n junction, which consists of a contact between a p-type piece of silicon, rich in holes, and an n-type piece of silicon, rich in electrons. N-type and p-type FETs are formed by implanting different types of dopants to selected regions of the device to form the necessary junction(s). N-type devices can be formed by implanting arsenic (As) or phosphorous (P), and p-type devices can be formed by implanting boron (B).

Further, as shown in FIG. 9, an inter-level dielectric (ILD) material 904 is then deposited to cap the source/drain region 902. The ILD material 904 is a low-k dielectric material such as, for example, an oxide material like silicon dioxide. The ILD material 904 is then recessed by chemical mechanical polishing (CMP) until the gate hardmask layer 300 is reached.

FIG. 10A depicts a top view of the semiconductor device 100 after a next fabrication stage. In particular, FIG. 10A depicts a top view of the semiconductor device 100 after a replacement metal gate (RMG) formation process is performed. FIG. 10B depicts cross-sectional view of the semiconductor device 100 wherein the cross-section is taken along A-A' of FIG. 10A. FIG. 10C depicts cross-sectional view of the semiconductor device 100 wherein the cross-section is taken along B-B' of FIG. 10A.

In this stage, as shown in FIG. 10B, first, the hard masks 300 are removed. Then, the dummy gates 380 and the silicon germanium sacrificial nanosheets 104 are removed by a known etching process, e.g., RIE or chemical oxide removal (COR). In a gate-late fabrication process, the removed dummy gate structure 380 is thereafter replaced with a replacement metal gate 1014 as known in the art. Dummy gate 380 can be removed by an etching process, e.g., RIE or COR, to form a trench. A dielectric material and one or more gate metals can then be deposited within the trench. For example, high-K (HK) dielectric material, e.g., hafnium based material, can be deposited to form a gate dielectric 1008. See, FIG. 10B. A metal liner, e.g., a work-function metal, and a gate metal can then be deposited on the gate dielectric material 1008 to complete the gate formation. In one or more embodiments of the invention, the metal liner can be, for example, TiN, TiAlN, TiAlC, TiC, or TaN, and the gate metal can be aluminum or tungsten. As shown in FIG. 10B and FIG. 10C, a self-aligned contact (SAC) cap 1012 is formed on top of the replacement metal gate 1014. The SAC cap 1012 is an insulating material, such as, silicon nitride, silicon borocarbonitride (SiBCN), silicon oxycarbonitride (SiOCN), silicon carbide (SiC) and etc. In one or more embodiments of the invention, the semiconductor device 100 includes both nFET and pFET replacement metal gates. For example, as illustrated in FIG. 10A, the semiconductor device includes a pFET replacement metal gate 1014A and a nFET replacement metal gate 1014B.

Techniques for forming high-K metal gate (HKMG) in gate openings are well-known in the art and, thus, the details have been omitted in order to allow the reader to focus on the salient aspects of the discussed herein. However, it should be understood that such HKMG will generally include formation of one or more gate dielectric layers (e.g., an inter-layer (IL) oxide and a high-k gate dielectric layer), which are deposited/formed so as to line the gate openings, and formation of one or more metal layers, which are deposited onto the gate dielectric layer(s) so as to fill the gate openings. The materials and thicknesses of the dielectric and metal layers used for the HKMG can be preselected to achieve desired work functions given the conductivity type of the FET. For explanation purposes, a high-K gate dielectric layer can be, for example, a dielectric material with a dielectric constant that is greater than the dielectric constant of silicon dioxide (i.e., greater than 3.9). Exemplary high-k dielectric materials include, but are not limited to, hafnium (Hf)-based dielectrics (e.g., hafnium oxide, hafnium silicon oxide, hafnium silicon oxynitride, hafnium aluminum oxide, etc.) or other suitable high-k dielectrics (e.g., aluminum oxide, tantalum oxide, zirconium oxide, etc.). Optionally, the metal layer(s) can include a work function metal that is immediately adjacent to the gate dielectric layer and that is preselected in order to achieve an optimal gate conductor work function given the conductivity type of the nanosheet-FET. For example, the optimal gate conductor work function for the PFETs can be, for example, between about 4.9 eV and about 5.2 eV. Exemplary metals (and metal alloys) having a work function within or close to this range include, but are not limited to, ruthenium, palladium, platinum, cobalt, and nickel, as well as metal oxides (aluminum carbon oxide, aluminum titanium carbon oxide, etc.) and metal nitrides (e.g., titanium nitride, titanium silicon nitride, tantalum silicon nitride, titanium aluminum nitride, tantalum aluminum nitride, etc.). The optimal gate conductor work function for NFETs can be, for example, between 3.9 eV and about 4.2 eV. Exemplary metals (and metal alloys) having a work function within or close to this range include, but are not limited to, hafnium, zirconium, titanium, tantalum, aluminum, and alloys thereof, such as, hafnium carbide, zirconium carbide, titanium carbide, tantalum carbide, and aluminum carbide. The metal layer(s) can further include a fill metal or fill metal alloy, such as tungsten, a tungsten alloy (e.g., tungsten silicide or titanium tungsten), cobalt, aluminum or any other suitable fill metal or fill metal alloy.

FIG. 11A depicts a top view of the semiconductor device 100 after a next fabrication stage. FIG. 11B depicts a cross-sectional side view of the semiconductor device 100 of FIG. 11A wherein the cross-section is taken along line A-A' in FIG. 11A. As best shown in FIG. 11B, selective etching is performed to cut a trench 1100 that extends through the SAC cap 1012, spacer material 402, the replacement metal gates 1014, and the shallow trench isolation (STI) 220 (see, FIG. 11B).

FIG. 12A depicts a top view of the semiconductor device 100 after a next fabrication stage. FIG. 12B depicts a cross-sectional side view of the semiconductor device 100 of FIG. 12A wherein the cross-section is taken along line A-A' in FIG. 12A. As shown in FIG. 12A and FIG. 12B, and as best shown in FIG. 12B, the trench 1100 is filled with an appropriate inherently tensile strained dielectric material 1200. In one or more embodiments of the invention, the trench 1100 is filled with tensile strained silicon nitride 1200.

The trench 1100 can have any suitable depth that exposes the sides of the replacement metal gate 1014A and 1014B (also referred to as work function metal) in order to induce a strain in the channel layers 106. In one or more embodiments of the invention, the depth of the trench 1100 can be about 50 to 150 nm.

As shown by directional arrows in the channel layers 106 shown in FIG. 12B, the inherently strained material 1200 creates strain in the channel layers 106. As shown in FIG. 12B, the strain is created in a direction that is transverse to the carrier transport direction in channel 106 (along source to drain). In other words, the strain is created in the width direction of the nanosheet channel layers 106. The strain is simply referred as 'transverse strain' throughout the specification. The width direction and the direction of the strain are shown in FIG. 12B.

Suitable amount of strain can be created in the nanosheet stack by appropriate selection of the strained material 1200 and thickness of the trench 1100 in FIGS. 11A and 11B. In one or more embodiments of the invention, the transverse tensile strain in the nanosheet stack is from 0.1 to 2 GPa.

In one or more embodiments of the invention, the trench 1100 is formed on the lateral sides of the replacement metal gates 1014. In one or more embodiments of the invention, the trench 1100 is not formed on the top of the metal gates 1014. In one or more embodiments of the invention, the strained material filled trench 1200 causes lateral strain in the nanosheet channels via strain transfer from strained material filled trench 1200 to metal gates and then to nanosheet channels. The lateral strain pulls the sheets in two opposite directions (as shown by arrows in the channel 106 shown in FIG. 12B) wherein both directions are in a plane transverse to the carrier transport direction in channel 106 and parallel to a lateral surface of the channel 106. The arrows represent forces in opposite directions. Transverse tensile strain improves carrier mobility for both nanosheet nFET and pFET with (100) as the dominant conducting surfaces, and thus can boost the performance of both Nanosheet nFET and pFET. In contrast, it is very challenging to generate transverse strain in nanosheet channels via source/drain epitaxy. Nanosheet source/drain epitaxy would have much lower strain level due to degraded epitaxy quality attributing to the fact that the epitaxy would grow from multiple seeds (ends of each nanosheet and/or the substrate) and then merge in the middle, which generates a lot of defects.

In one or more embodiments of the invention, the semiconductor device 100 includes both n-type and p-type FETs. In one or more embodiments of the invention, the strained material filled trench 1200 creates transverse strain in both n-type and p-type FETs. In one or more embodiments of the invention, the strain is created in only one of the n-type or p-type FETs.

The present inventors have found that the strained channel layers 106 provide superior channel mobility. In other words, the transverse strain enhances channel mobility. The enhanced channel mobility is observed in both n-type as well as p-type FETs.

FIG. 13 depicts a flow diagram illustrating a methodology 1300 according to one or more embodiments of the present invention. At block 1302, alternating sacrificial and channel nanosheets 104 and 106 are formed. At block 1304, the nanosheets are patterned into fins 240, 260 and shallow trench isolation (STI) regions 220 are formed. Block 1306 forms dummy gates 380 over the sidewalls of the fins 240, 260 and also forms a hard mask 300 over the dummy gates 380. Block 1308 forms offset spacers 402 over the sidewalls of the dummy gates 380 and the hard masks 300. At block 1310, the fins 240, 260 are etched to form source/drain recesses 504. Block 1312 etches back sacrificial nanosheets 104 to form cavities 606. For example, cavities 606 are shown in FIG. 7. Block 1314 deposits conformal inner spacer material 702 over the device. At block 1316, all of the inner spacer material 702 that is outside the cavities 606 in the sacrificial nanosheets 104 (e.g. cavities 606) is removed by etching. Thus, at block 1316, cavities filled with inner spacer material 702 are obtained. Block 1318 grows source/drain regions 902 by epitaxy. Growing the source/drain regions 902 can include in-situ doping to form the necessary junctions for either n-type or p-type nanosheet FET devices, including, optionally, extension junctions in the nanosheets at the interface between the nanosheets and the source/drain regions. Block 1318 also deposits inter-level dielectric (ILD) 904 and performs chemical mechanical planarization. Block 1320 removes the dummy gates 380 and forms replacement metal gate (RMG) 1014. Block 1320 also forms self-aligned contact (SAC) cap 1012. At block 1322, a trench 1100 is cut into the SAC Cap 1012 and spacer 402 extending through the replacement metal gate 1014 and ILD 904 and reaching up to the shallow trench isolation 220. At block 1324, the trench is filled with an inherently tensile strained material 1200 (for example, tensile strained silicon nitride).

Various embodiments of the present invention are described herein with reference to the related drawings. Alternative embodiments can be devised without departing from the scope of this invention. Although various connections and positional relationships (e.g., over, below, adjacent, etc.) are set forth between elements in the following description and in the drawings, persons skilled in the art will recognize that many of the positional relationships described herein are orientation-independent when the described functionality is maintained even though the orientation is changed. These connections and/or positional relationships, unless specified otherwise, can be direct or indirect, and the present invention is not intended to be limiting in this respect. Accordingly, a coupling of entities can refer to either a direct or an indirect coupling, and a positional relationship between entities can be a direct or indirect positional relationship. As an example of an indirect positional relationship, references in the present description to forming layer "A" over layer "B" include situations in which one or more intermediate layers (e.g., layer "C") is between layer "A" and layer "B" as long as the relevant characteristics and functionalities of layer "A" and layer "B" are not substantially changed by the intermediate layer(s).

The following definitions and abbreviations are to be used for the interpretation of the claims and the specification. As used herein, the terms "comprises," "comprising," "includes," "including," "has," "having," "contains" or "containing," or any other variation thereof, are intended to cover a non-exclusive inclusion. For example, a composition, a mixture, process, method, article, or apparatus that comprises a list of elements is not necessarily limited to only those elements but can include other elements not expressly listed or inherent to such composition, mixture, process, method, article, or apparatus.

Additionally, the term "exemplary" is used herein to mean "serving as an example, instance or illustration." Any embodiment or design described herein as "exemplary" is not necessarily to be construed as preferred or advantageous over other embodiments or designs. The terms "at least one" and "one or more" are understood to include any integer number greater than or equal to one, i.e. one, two, three, four, etc. The terms "a plurality" are understood to include any integer number greater than or equal to two, i.e. two, three, four, five, etc. The term "connection" can include an indirect "connection" and a direct "connection."

References in the specification to "one embodiment," "an embodiment," "an example embodiment," etc., indicate that the embodiment described can include a particular feature, structure, or characteristic, but every embodiment may or may not include the particular feature, structure, or characteristic. Moreover, such phrases are not necessarily referring to the same embodiment. Further, when a particular feature, structure, or characteristic is described in connection with an embodiment, it is submitted that it is within the knowledge of one skilled in the art to affect such feature, structure, or characteristic in connection with other embodiments whether or not explicitly described.

For purposes of the description hereinafter, the terms "upper," "lower," "right," "left," "vertical," "horizontal," "top," "bottom," and derivatives thereof shall relate to the described structures and methods, as oriented in the drawing figures. The terms "overlying," "atop," "on top," "positioned on" or "positioned atop" mean that a first element, such as a first structure, is present on a second element, such as a second structure, wherein intervening elements such as an interface structure can be present between the first element and the second element. The term "direct contact" means that a first element, such as a first structure, and a second element, such as a second structure, are connected without any intermediary conducting, insulating or semiconductor layers at the interface of the two elements.

Spatially relative terms, e.g., "beneath," "below," "lower," "above," "upper," and the like, can be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the term "below" can encompass both an orientation of above and below. The device can be otherwise oriented (rotated 90 degrees or at other orientations) and the spatially relative descriptors used herein interpreted accordingly.

The phrase "selective to," such as, for example, "a first element selective to a second element," means that the first element can be etched and the second element can act as an etch stop.

The terms "about," "substantially," "approximately," and variations thereof, are intended to include the degree of error associated with measurement of the particular quantity based upon the equipment available at the time of filing the application. For example, "about" can include a range of ±8% or 5%, or 2% of a given value.

The term "conformal" (e.g., a conformal layer) means that the thickness of the layer is substantially the same on all surfaces, or that the thickness variation is less than 15% of the nominal thickness of the layer.

As previously noted herein, for the sake of brevity, conventional techniques related to semiconductor device and IC fabrication may or may not be described in detail herein. By way of background, however, a more general description of the semiconductor device fabrication processes that can be utilized in implementing one or more embodiments of the present invention will now be provided. Although specific fabrication operations used in implementing one or more embodiments of the present invention can be individually known, the described combination of operations and/or resulting structures of the present invention are unique. Thus, the unique combination of the operations described according to the present invention utilize a variety of individually known physical and chemical processes performed on a semiconductor (e.g., silicon) substrate, some of which are described in the immediately following paragraphs.

In general, the various processes used to form a microchip that will be packaged into an IC fall into four general categories, namely, film deposition, removal/etching, semiconductor doping and patterning/lithography. Deposition is any process that grows, coats, or otherwise transfers a material onto the wafer. Available technologies include physical vapor deposition (PVD), chemical vapor deposition (CVD), plasma-enhanced chemical vapor deposition (PECVD), electrochemical deposition (ECD), molecular beam epitaxy (MBE), and more recently, atomic layer deposition (ALD) and plasma-enhanced atomic layer deposition (PEALD), among others.

Removal/etching is any process that removes material from the wafer. Examples include etch processes (either wet or dry), and chemical-mechanical planarization (CMP), and the like. A wet etch process, such as a buffered hydrofluoric acid (BHF) etch, is a material removal process that uses liquid chemicals or etchants to remove materials from a surface. A dry etch process, such as reactive ion etching (RIE), uses chemically reactive plasma to remove a material, such as a masked pattern of semiconductor material, by exposing the material to a bombardment of ions that dislodge portions of the material from the exposed surface. The plasma is generated under low pressure (vacuum) by an electromagnetic field.

Semiconductor doping is the modification of electrical properties by doping, for example, transistor sources and drains, generally by in-situ epitaxy, diffusion and/or by ion implantation. These doping processes are followed by furnace annealing or by rapid thermal annealing (RTA). Annealing serves to activate the implanted dopants. Films of both conductors (e.g., poly-silicon, aluminum, copper, etc.) and insulators (e.g., various forms of silicon dioxide, silicon nitride, etc.) are used to connect and isolate transistors and their components. Selective doping of various regions of the semiconductor substrate allows the conductivity of the substrate to be changed with the application of voltage. By creating structures of these various components, millions of transistors can be built and wired together to form the complex circuitry of a modern microelectronic device.

Semiconductor lithography is the formation of three-dimensional relief images or patterns on the semiconductor substrate for subsequent transfer of the pattern to the substrate. In semiconductor lithography, the patterns are formed by a light sensitive polymer called a photo-resist. To build the complex structures that make up a transistor and the many wires that connect the millions of transistors of a circuit, lithography and etch pattern transfer steps are repeated multiple times. Each pattern being printed on the wafer is aligned to the previously formed patterns and slowly the conductors, insulators and selectively doped regions are built up to form the final device.

The flowchart and block diagrams in the Figures illustrate possible implementations of fabrication and/or operation methods according to various embodiments of the present invention. Various functions/operations of the method are represented in the flow diagram by blocks. In some alternative implementations, the functions noted in the blocks can occur out of the order noted in the Figures. For example, two blocks shown in succession can, in fact, be executed substantially concurrently, or the blocks can sometimes be executed in the reverse order, depending upon the functionality involved.

The descriptions of the various embodiments of the present invention have been presented for purposes of illustration, but are not intended to be exhaustive or limited to the embodiments described. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments described herein.

What is claimed is:

1. A semiconductor device comprising:
   a nanosheet stack formed on a substrate, the nanosheet stack comprising nanosheet channels;
   source and drain regions formed on the substrate;
   a gate around the nanosheet stack;
   a spacer formed on a sidewall of the gate;
   an inter-layer dielectric formed adjacent to the spacer; and
   a trench formed in a portion of the gate, the spacer, and the inter-level dielectric and extending toward the substrate, wherein the trench is filled with a strained material.

2. The semiconductor device of claim 1, wherein the strained material is structured to create a strain in the nanosheet stack.

3. The semiconductor device of claim 2, wherein:
   the strain is created in a direction that is transverse to a carrier transport direction in the nanosheet channels of the nanosheet stack; and
   a strain direction is parallel to a lateral surface of the nanosheet stack.

4. The semiconductor device of claim 1 further comprising one or more inner spacers located between the nanosheet channels.

5. The semiconductor device of claim 1, wherein the strained material comprises tensile strained silicon nitride.

6. The semiconductor device of claim 1, wherein a depth of the trench comprises from about 50 to about 150 nm.

7. The semiconductor device of claim 2, wherein the strain created in the nanosheet stack comprises from about 0.1 to about 2 GPa.

8. The semiconductor device of claim 1, wherein the trench is formed on a lateral side of the gate and extends from a self-aligned contact (SAC) cap toward the substrate.

9. A semiconductor device comprising:
   a first nanosheet transistor formed on a substrate, the first nanosheet transistor comprising a first nanosheet stack and a p-type gate over channel regions of the first nanosheet stack;

a second nanosheet transistor formed on the substrate, the second nanosheet transistor comprising a second nanosheet stack and an n-type gate over channel regions of the second nanosheet stack; and a tensile strained region having a first portion in direct contact with sidewalls of the p-type gate and a second portion in direct contact with sidewalls of the n-type gate;

wherein the channel regions of the first nanosheet stack and the channel regions of the second nanosheet stack each comprise a strained channel.

10. The semiconductor device of claim 9 further comprising source and drain regions formed on the substrate.

11. The semiconductor device of claim 10, wherein carrier transport is in a first direction from the source to the drain.

12. The semiconductor device of claim 11, wherein the strained channels comprise a strain that is transverse to the first direction.

13. The semiconductor device of claim 9, wherein the tensile strained region is structured to create a tensile strain in the first nanosheet stack and a tensile strain in the second nanosheet stack.

14. The semiconductor device of claim 13, wherein:
the strain is created in a strain direction that is transverse to a carrier transport direction in the channel regions; and
a strain direction is parallel to a lateral surface of the first nanosheet stack.

15. The semiconductor device of claim 10 further comprising one or more inner spacers located between the channel regions and the source and drain regions.

16. The semiconductor device of claim 9, wherein the tensile strained region comprises tensile strained silicon nitride.

17. The semiconductor device of claim 9 further comprising a shallow trench isolation region.

18. The semiconductor device of claim 17, wherein the tensile strained region is positioned in a trench that recesses the shallow trench isolation.

19. The semiconductor device of claim 18, wherein the trench comprises a depth from 50 to 150 nm.

20. The semiconductor device of claim 9, wherein the strained channels each comprise a strain from about 0.1 to about 2 GPa.

* * * * *